United States Patent
Park et al.

(10) Patent No.: US 10,347,451 B2
(45) Date of Patent: Jul. 9, 2019

(54) PRINTED CIRCUIT BOARD ASSEMBLY

(71) Applicant: MANDO Corporation, Pyeongtaek-si, Gyeonggi-do (KR)

(72) Inventors: Moon Jung Park, Hanam-si (KR); Gon Jae Lee, Yongin-si (KR)

(73) Assignee: MANDO CORPORATION, Pyeongtaek-si, Gyeonggi-do (KR)

( * ) Notice: Subject to any disclaimer, the term of this patent is extended or adjusted under 35 U.S.C. 154(b) by 0 days.

(21) Appl. No.: 15/794,121

(22) Filed: Oct. 26, 2017

(65) Prior Publication Data

US 2018/0114657 A1    Apr. 26, 2018

(30) Foreign Application Priority Data

Oct. 26, 2016    (KR) .................. 10-2016-0140195

(51) Int. Cl.
| | |
|---|---|
| *H01H 37/76* | (2006.01) |
| *H01H 85/055* | (2006.01) |
| *H01H 85/20* | (2006.01) |
| *H01H 85/36* | (2006.01) |
| *H05K 1/02* | (2006.01) |
| *H01H 37/04* | (2006.01) |
| *H01H 85/02* | (2006.01) |

(52) U.S. Cl.
CPC ........ *H01H 37/761* (2013.01); *H01H 85/055* (2013.01); *H01H 85/20* (2013.01); *H01H 85/36* (2013.01); *H05K 1/0201* (2013.01); *H01H 2037/046* (2013.01); *H01H 2085/0275* (2013.01); *H05K 1/0263* (2013.01); *H05K 2201/0311* (2013.01); *H05K 2201/1031* (2013.01); *H05K 2201/10181* (2013.01); *Y02P 70/611* (2015.11)

(58) Field of Classification Search
CPC ... H01H 37/761; H01H 2037/762–763; H01H 2085/0414; H01H 85/055; H01H 85/20; H01H 85/36; H01H 2037/046; H01H 2085/0275; H05K 1/112; H05K 1/113; H05K 1/115; H05K 1/0201; H05K 1/0263; H05K 1/0311; H05K 1/1031; H05K 1/10181; Y02P 70/611
USPC ....................................................... 337/297
See application file for complete search history.

(56) References Cited

U.S. PATENT DOCUMENTS 5,280,262 A * 1/1994 Fischer ............... H01H 37/761
                                                              337/402
5,770,993 A * 6/1998 Miyazawa .............. H01C 7/13
                                                              337/142

(Continued)

FOREIGN PATENT DOCUMENTS

| DE | 102016007594 A1 | 12/2016 |
|---|---|---|
| JP | 2005-38675 A | 2/2005 |
| KR | 10-1505865 B1 | 3/2015 |

*Primary Examiner* — Jacob R Crum
(74) *Attorney, Agent, or Firm* — Hauptman Ham, LLP (57) ABSTRACT

A printed circuit board (PCB) assembly according to one embodiment of the present disclosure includes a first pad; a second pad disposed to be spaced apart from the first pad; and a thermal fuse provided with a first terminal and a second terminal which are each coupled to the first pad and the second pad by soldering. Here, a contact area between the first pad and the first terminal is smaller than that between the second pad and the second terminal.

7 Claims, 6 Drawing Sheets

(56) References Cited

U.S. PATENT DOCUMENTS

| | | | | |
|---|---|---|---|---|
| 8,749,940 | B2* | 6/2014 | Schmidtlein | H01H 37/761 361/103 |
| 2004/0037044 | A1* | 2/2004 | Cook | H01L 23/3677 361/719 |
| 2008/0236871 | A1* | 10/2008 | Schaefer | H05K 1/111 174/250 |
| 2009/0027156 | A1* | 1/2009 | Schlenker | H01H 37/761 337/404 |
| 2011/0050386 | A1* | 3/2011 | Schlenker | H01H 37/761 337/407 |
| 2014/0238729 | A1* | 8/2014 | Hsiao | H05K 1/0206 174/252 |
| 2015/0041207 | A1* | 2/2015 | Tang | H05K 1/0225 174/266 |
| 2015/0340181 | A1* | 11/2015 | Ho | H01H 37/761 337/407 |

* cited by examiner

PRINTED CIRCUIT BOARD ASSEMBLY

CROSS-REFERENCE TO RELATED APPLICATION

This application claims priority to and the benefit of Korean Patent Application No. 10-2016-0140195, filed on Oct. 26, 2016, the disclosure of which is incorporated herein by reference in its entirety.

BACKGROUND

1. Field of the Invention

The present disclosure relates to a printed circuit board (PCB) with a thermal fuse for surface mounting, and more particularly, to a PCB assembly configured to protect a circuit of an electronic device when a high temperature or an overcurrent is applied thereto.

2. Discussion of Related Art

Generally, an electronic product using electricity always has a possibility of accident due to an overcurrent and overheating, and a disposable fuse made of a material melted by heat of a predetermined temperature is used to prevent the possibility of accident.

However, the disposable fuse is low cost but is not reusable, so that costs resulting from replacement occur after the disposable fuse is used. To resolve the above-described problem, a bimetal fuse in which different metal plates having different coefficients of thermal expansion are bonded has been developed, but since the bimetal fuse performs only a contact function, operation deviation thereof according to a temperature is large, and a separate limit switch and the like are required.

Recently, a shape memory alloy fuse using a shape memory alloy and a polymer fuse using a special polymer have been developed to be continuously usable, but the polymer fuse has deteriorated stability resulting from a chemical product and also has a problem in that a fire hazard is caused by an explosion and the like when a voltage or current is abruptly varied.

Also, recently, since an electronic device is mainly surface-mounted on a printed circuit board (PCB), a fuse is also required to be surface mountable on the PCB. However, since a temperature of about 270° C. or more is required to perform soldering in a mounting process, a typical disposable fuse may be melted due to an inherent characteristic of the disposable fuse. The bimetal fuse or the polymer fuse may resolve the above-described problem, however a component size thereof is excessively large and a possibility of deterioration thereof is high due to the soldering temperature so that it is very difficult to use the bimetal fuse or the polymer fuse as a surface mounted thermal fuse.

Meanwhile, in the case of a surface-mounted fuse, solder on a terminal having a fixing function is melted due to heat generated by an overcurrent and the like such that provision of a fixing function fails. At this point, since the terminal having the fixing function does not serve as a support for a terminal which should be detached from a PCB by an elastic force, a function of a thermal fuse is deteriorated.

SUMMARY OF THE INVENTION

Therefore, an objective of the present disclosure is to provide a printed circuit board (PCB) assembly capable of ensuring operational reliability of a thermal fuse against an overcurrent.

Also, another objective of the present disclosure is to provide a PCB assembly capable of being surface-mounted and also being easily manufactured.

Objectives of the present disclosure are not limited to the above-described objectives, and other objectives not mentioned above can be clearly understood by those skilled in the art from the following description.

It is an aspect of the present disclosure to provide a PCB assembly including a first pad; a second pad disposed to be spaced apart from the first pad; and a thermal fuse provided with a first terminal and a second terminal which are each coupled to the first pad and the second pad by soldering, wherein a contact area between the first pad and the first terminal is smaller than that between the second pad and the second terminal.

In one embodiment, an amount of solder that is soldered between the first pad and the first terminal may be less than that of solder that is soldered between the second pad and the second terminal.

In one embodiment, the thermal fuse may be formed of an elastic material.

In one embodiment, when an overcurrent flows into the thermal fuse, solder between the first terminal and the first pad may be more rapidly melted than that between the second terminal and the second pad.

In one embodiment, the thermal fuse may be provided with an extension configured to connect the first terminal and the second terminal, and the extension may have a form in which the first terminal is mounted or detached from the first pad by an elastic force.

In one embodiment, at least one via hole may be formed on the first pad.

In one embodiment, via holes may be formed on the first pad and the second pad, and the number of via holes formed on the first pad may be greater than the number of via holes formed on the second pad.

In one embodiment, the PCB assembly may further include a housing configured to accommodate the first pad, the second pad, and the thermal fuse.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION OF EXEMPLARY EMBODIMENTS

Preferred embodiments of the present disclosure will be described in detail with reference to the drawings. The same reference numerals are given to the same or similar components regardless of reference numerals, and repetitive descriptions thereof will be omitted.

Also, in the following description of the present disclosure, when a detailed description of a known related art is determined to obscure the gist of the present disclosure, the detailed description thereof will be omitted. Further, it should be noted that the accompanying drawings are provided only to facilitate understanding of the spirit of the present disclosure, and the spirit of the present disclosure is not to be construed as limited to these drawings.

Figure 1:
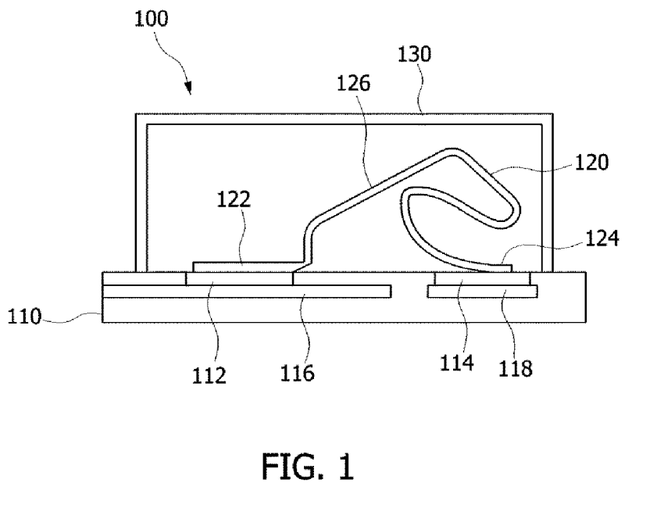
FIG. 1 is a cross-sectional view of a printed circuit board (PCB) assembly according to one embodiment of the present disclosure.
Figure 2:
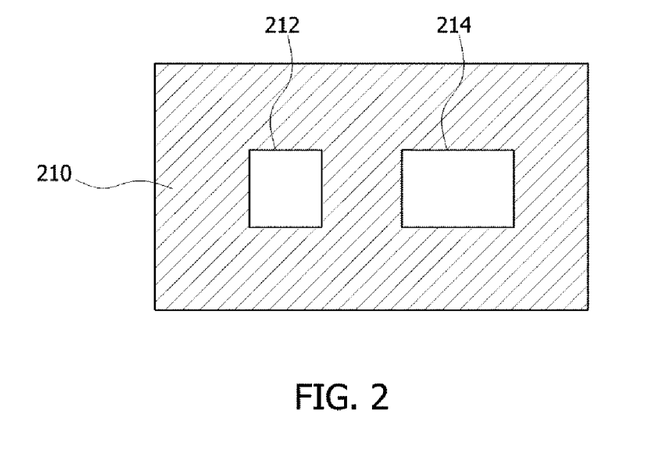
FIG. 2 is a plan view illustrating one example of a PCB in the PCB assembly according to one embodiment of the present disclosure.

Hereinafter, a printed circuit board (PCB) assembly according to one embodiment of the present disclosure will be described with reference to FIGS. 1 and 2. FIG. 1 is a cross-sectional view of a PCB assembly according to one embodiment of the present disclosure, and FIG. 2 is a plan view illustrating one example of a PCB in the PCB assembly according to one embodiment of the present disclosure.

As shown in FIG. 1, a PCB assembly 100 according to one embodiment of the present disclosure includes a PCB 110 and a thermal fuse 120.

A first pad 112 and a second pad 114 disposed to be spaced apart from the first pad 112 are formed on the PCB 110, and a thermal fuse 120 is solder-coupled to the first pad 112 and the second pad 114. Here, the first pad 112 and the second pad 114 are generally plated with gold (Au) to promote electrical conduction. In addition, wirings 116 and 118 which are each connected to the first pad 112 and the second pad 114 may be provided inside the PCB 110.

The thermal fuse 120 includes a first terminal 122 soldered to the first pad 112, a second terminal 124 soldered to the second pad 114, and an extension 126 connecting the first terminal 122 and the second terminal 124. The thermal fuse 120 is configured to usually electrically conduct the first pad 112 and the second pad 114 of the PCB 110, and is configured such that, when an overcurrent is generated in the PCB 110 and the PCB 110 is overheated thereby, solder connecting the first terminal 122 of the thermal fuse 120 and the first pad 112 is partially melted to allow the first terminal 122 to be detached from the first pad 112 and prevent damage to a circuit and devices connected thereto.

For the above-described configuration, as shown in FIG. 1, since the thermal fuse 120 should be formed to allow a force to be applied thereto in a direction in which the first terminal 122 is detached from the first pad 112 and also should be formed to be electrically conductive, the thermal fuse 120 may be formed of an elastic material. As one example, the thermal fuse 120 is preferably formed of an elastic piece which is made of a metal. That is, the thermal fuse 120 may have a form in which the first terminal 122 is detached from the first pad 112 by an elastic force of the extension 126.

Therefore, there is no need to form a separate hole configured to fix the thermal fuse 120 to the PCB 110, and also only a pad configured to fix one side and the other side of the thermal fuse 120 to the PCB 110 is formed so that the thermal fuse 120 may be easily mounted on the PCB 110 through soldering without disposing a separate member for fixing.

Meanwhile, in the above-described PCB assembly 100, when the second terminal 124 of the thermal fuse 120 is more rapidly detached from the second pad 114 than the first terminal 122 or when solder of the second terminal 124 is more rapidly melted than that of the first terminal 122 such that the second terminal 124 moves, even though the first terminal 122 is separated from the first pad 112, the thermal fuse 120 may maintain an electrical connection between the first pad 112 and the second pad 114.

For example, when solder between the second terminal 124 and the second pad 114 is rapidly melted, the second terminal 124 does not properly support the thermal fuse 120, and, in this case, an elastic force upwardly applied to the first terminal 122 is significantly reduced due to the second terminal 124. As a result, since the first terminal 122 is not completely separated from the first pad 112 even when the solder between the first terminal 122 and the first pad 112 is melted, a problem in that the thermal fuse 120 does not fulfill its role occurs.

To prevent the above-described problem, the PCB assembly 100 according to one embodiment of the present disclosure is configured such that a contact area between the first pad 112 and the first terminal 122 is formed to be smaller than that between the second pad 114 and the second terminal 124 to allow the first terminal 122 of the thermal fuse 120 to be more rapidly detached from the first pad 112 formed on the PCB than the second terminal 124 when the PCB 110 is overheated due to an inflow of an overcurrent and the like.

Accordingly, when an overcurrent flows into the thermal fuse 120, since heat generated by the overcurrent passing through the contact area between the first pad 112 and the first terminal 122 is greater than that generated by the overcurrent passing through the contact area between the second pad 114 and the second terminal 124, the solder between the first terminal 122 and the first pad 112 is more rapidly melted than that between the second terminal 124 and the second pad 114 such that the first terminal 122 may provide a supporting force to the second terminal 124. Consequently, the first terminal 122 may be easily separated from the first pad 112 of the PCB 110 by an elastic force based on the second terminal 124.

In addition, separation between the first pad 112 and first terminal 122 and between the second pad 114 and second terminal 124 may be determined by an amount of solder that is soldered therebetween.

Accordingly, the PCB assembly 100 may be formed such that the amount of the solder that is soldered between the first pad 112 and the first terminal 122 is less than that of the solder that is soldered between the second pad 114 and the second terminal 124.

Figure 3:
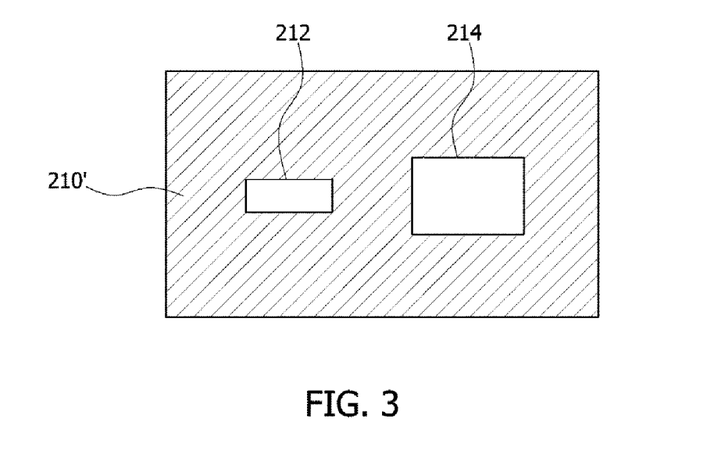
FIG. 3 is a plan view illustrating another example of a PCB in the PCB assembly according to one embodiment of the present disclosure.

Specifically, as shown in FIGS. 2 and 3, to realize the above-described technical feature, the PCB assembly 100 may be formed such that a contact area of the first pad 212 is smaller than that of the second pad 214.

Figure 4:
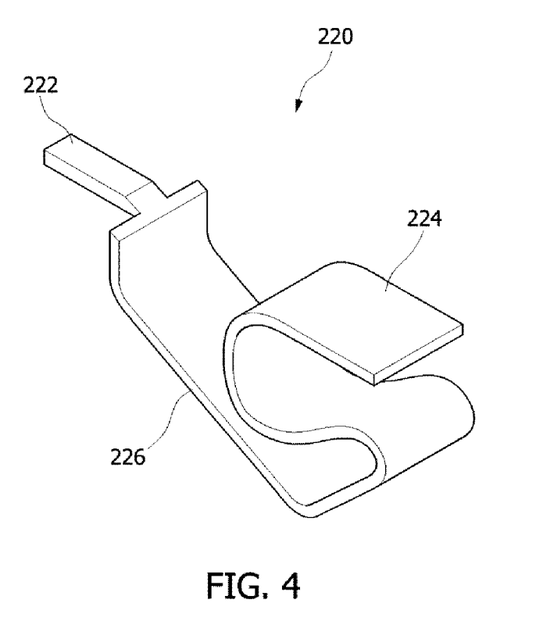
FIG. 4 is a bottom perspective view illustrating a thermal fuse corresponding to the PCB of FIG. 3.

FIG. 3 is a plan view illustrating another example of a PCB in the PCB assembly according to one embodiment of the present disclosure, and FIG. 4 is a bottom perspective view illustrating a thermal fuse corresponding to the PCB of FIG. 3.

A PCB 210 is configured such that the terminals 122 and 124 of the thermal fuse 120 have different contact areas while having the same shape, and a PCB 210' is configured such that the terminals 122 and 124 of the thermal fuse 120 have different contact areas and different shapes.

As shown in FIG. 4, a thermal fuse 220 may be formed such that at least one of a width and a length of a first terminal 222 is less than that of a width and a length of a second terminal 224. That is, the thermal fuse 220 may be formed such that a contact area of the first terminal 222 is smaller than that of the second terminal 224.

Figure 5:
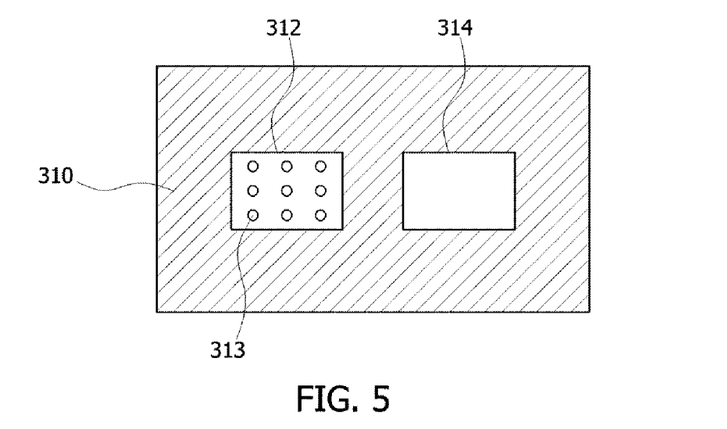
FIG. 5 is a plan view illustrating still another example of a PCB in the PCB assembly according to one embodiment of the present disclosure.
Figure 6:
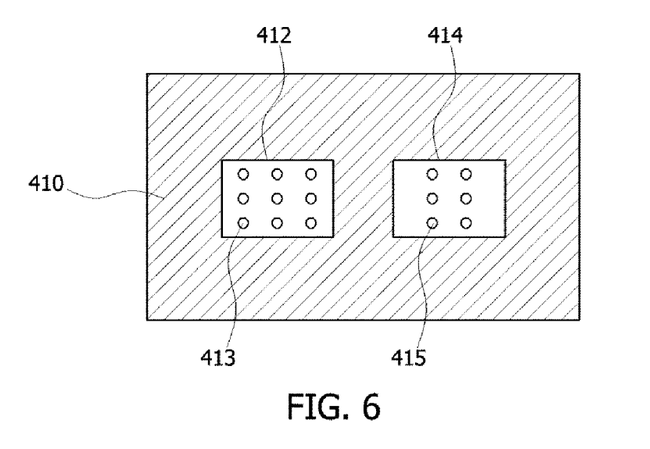
FIG. 6 is a plan view illustrating yet another example of a PCB in the PCB assembly according to one embodiment of the present disclosure.

FIG. 5 is a plan view illustrating still another example of a PCB in the PCB assembly according to one embodiment of the present disclosure, and FIG. 6 is a plan view illustrating yet another example of a PCB in the PCB assembly according to one embodiment of the present disclosure.

As shown in FIG. 5, at least one via hole 313 may be provided in a first pad 312 of a PCB 310. Here, the first pad 312 and a second pad 314 may have the same area, but a contact area of the first pad 312 may preferably be formed to be smaller than that of the second pad 314.

As described above, since the via hole 313 is formed on only the first pad 312 that is solder-bonded to the first terminal 122 of the thermal fuse 120 such that a portion of the first pad 312 at which the via hole 313 is formed is not in contact with the first terminal 122, a contact area between the first terminal 122 and the first pad 312 may be smaller than that between the second terminal 124 and the second pad 314.

In addition, since solder is not formed at the via hole 313, an amount of solder that is soldered between the first pad 312 and the first terminal 122 may be less than that of solder that is soldered between the second pad 314 and the second terminal 124.

Meanwhile, as shown in FIG. 6, via holes 413 and 415 may be respectively provided on a first pad 412 and a second pad 414 of a PCB 410. Here, the number of the via holes 413 provided on the first pad 412 may be formed to be greater than the number of the via holes 415 provided on the second pad 414.

Similar to FIG. 5, the first pad 412 and the second pad 414 may have the same area, but a contact area of the first pad 412 may preferably be formed to be smaller than that of the second pad 414.

In addition, since solder is not formed at the via holes 413 and 415, an amount of solder that is soldered between the first pad 412 having a larger number of the via holes 413 and the first terminal 122 may be less than that of solder that is soldered between the second pad 414 having a smaller number of the via holes 415 and the second terminal 124.

In addition, the number of the via holes 413 and 415 respectively provided on the first pad 412 and the second pad 414 may be determined in consideration of a bonding strength between the first pad 412 and the first terminal 122 and between the second pad 414 and the second terminal 124. That is, the bonding strength between the first pad 412 and the first terminal 122 and between the second pad 414 and the second terminal 124 may be adjusted according to the number of the via holes 413 and 415.

Further, as shown in FIG. 1, a housing 300 capable of accommodating the first pad 112, the second pad 114, and the thermal fuse 120 may be separately provided in the PCB assembly 100 according to one embodiment of the present disclosure, and the housing 300 may prevent damage to the first pad 112, the second pad 114, and the thermal fuse 120 by an external contact.

With such a configuration, when the PCB 110 is overheated due to an overcurrent, the first terminal 122 of the thermal fuse 120 may be more rapidly separated from the PCB 110 than the second terminal 124 such that a malfunction of the thermal fuse 120 may be prevented.

In accordance with the PCB assembly according to one embodiment of the present disclosure, a pad and a terminal are formed on a PCB to allow a terminal having a detaching function to be more rapidly detached from the pad formed on the PCB than the terminal having a fixing function when a thermal fuse or the PCB is overheated due to an overcurrent and the like, and thus a rapid detachment or movement of the terminal having the fixing function can be prevented such that operational reliability of the thermal fuse can be secured.

Also, in accordance with the present disclosure, a thermal fuse is solder-mounted on a pad formed on a PCB so that surface mounting of the thermal fuse can be easily implemented.

Effects of the present disclosure are not limited to the above described effects, and other effects not mentioned above can be clearly understood by those skilled in the art from the following description.

The embodiments described herein and the accompanying drawings are merely illustrative of some of the technical spirit included in the present disclosure. Therefore, the embodiments disclosed herein are not to be taken in a sense of limiting the technical spirit of the present disclosure but as an explanation thereof, and the range of the technical spirit is not limited to these embodiments. It should be understood that modified and concrete embodiments can be easily devised by those skilled in the art that without departing from the spirit and scope of the present disclosure within the technical spirit of the description and the accompanying drawings of the present disclosure, and that these modified and concrete embodiments are included in the scope and spirit of the present disclosure.

What is claimed is:

1. A printed circuit board (PCB) assembly comprising:
   a first pad which is configured in a single pad and includes a plurality of via holes formed on the first pad;
   a second pad disposed to be spaced apart from the first pad, wherein the second pad has no via holes thereon, or the second pad has via holes, formed thereon, smaller than a number of via holes formed on the first pad, and wherein both the plurality of via holes formed on the first pad and the via holes formed on the second pad are configured to determine a first bonding strength and a second bonding strength; and
   a thermal fuse provided with a first terminal and a second terminal which are each coupled to a surface of the first pad and a surface of the second pad by soldering without inserting either of the first terminal and the second terminal into a hole to be mounted in the PCB,
   wherein the first bonding strength between the first pad and the first terminal is determined to be lesser than the second bonding strength between the second pad and the second terminal,
   (i) by determining that a contact area between the first pad and the first terminal is smaller than that between the second pad and the second terminal, or
   (ii) by adjusting a number of via holes to be formed on the first pad greater than a number of via holes to be formed on the second pad.

2. The PCB assembly of claim 1, wherein an amount of solder that is soldered between the first pad and the first terminal is less than that of solder that is soldered between the second pad and the second terminal.

3. The PCB assembly of claim 1, wherein the thermal fuse is formed of an elastic material.

4. The PCB assembly of claim 1, wherein, when an overcurrent flows into the thermal fuse, solder between the first terminal and the first pad is more rapidly melted than that between the second terminal and the second pad.

5. The PCB assembly of claim 1, wherein:
   the thermal fuse is provided with an extension connecting the first terminal and the second terminal, and
   the extension has a form in which the first terminal is detached from the first pad by an elastic force.

6. The PCB assembly of claim 1, wherein the via holes are formed on the first pad only.

7. The PCB assembly of claim 1, further comprising a housing accommodating the first pad, the second pad, and the thermal fuse.

\* \* \* \* \*